United States Patent
Pui et al.

(10) Patent No.: US 7,558,123 B2
(45) Date of Patent: Jul. 7, 2009

(54) EFFICIENT AND SYSTEMATIC MEASUREMENT FLOW ON DRAIN VOLTAGE FOR DIFFERENT TRIMMING IN FLASH SILICON CHARACTERIZATION

(75) Inventors: Woon-Sang Pui, Johor (MY);
Kian-Huat Hoo, Penang (MY);
Joon-Siong Pang, Penang (MY)

(73) Assignee: Spansion LLC, Sunnyvale, CA (US)

( * ) Notice: Subject to any disclaimer, the term of this patent is extended or adjusted under 35 U.S.C. 154(b) by 30 days.

(21) Appl. No.: 11/837,949

(22) Filed: Aug. 13, 2007

(65) Prior Publication Data
US 2009/0049231 A1 Feb. 19, 2009

(51) Int. Cl.
*G11C 7/00* (2006.01)
(52) U.S. Cl. .................. 365/189.011; 365/189.01; 365/189.17; 365/230.01; 365/210.12; 365/233.12
(58) Field of Classification Search .......... 365/189.011, 365/185.26, 185.18, 185.2, 189.07
See application file for complete search history.

(56) References Cited

U.S. PATENT DOCUMENTS

| 5,930,185 | A * | 7/1999 | Wendell ................ 365/201 |
| 6,377,487 | B1 * | 4/2002 | Lee .................. 365/185.11 |
| 6,594,183 | B1 * | 7/2003 | Lofgren et al. ......... 365/185.33 |
| 6,738,953 | B1 | 5/2004 | Sabharwal et al. |
| 7,009,887 | B1 | 3/2006 | Hsia et al. |

* cited by examiner

*Primary Examiner*—Pho M. Luu
*Assistant Examiner*—Tha-o Bui
(74) *Attorney, Agent, or Firm*—Turocy & Watson, LLP

(57) ABSTRACT

Systems and methods that facilitate characterization of a flash memory device are presented. A characterization component can be associated with a regulator component included in a memory device to facilitate setting and measuring respective drain voltage levels for programming, erase, and soft programming operations at address bit combinations available for the respective operations. The characterization component can utilize external address bits that can be fixed when performing the operations to minimize disruption to the drain voltage measurement flow. The characterization component can detect when a particular operation has already been performed based in part on an applicable portion of the address bit combination associated with such operation, and can bypass such operation at that address bit combination to proceed to the next operation that has yet to be performed thereby efficiently setting and measuring drain voltage levels for various operations and trim settings to characterize the memory device.

20 Claims, 7 Drawing Sheets

EFFICIENT AND SYSTEMATIC MEASUREMENT FLOW ON DRAIN VOLTAGE FOR DIFFERENT TRIMMING IN FLASH SILICON CHARACTERIZATION

BACKGROUND

A wide variety of memory devices can be used to maintain and store data and instructions for various computers and similar systems. In particular, flash memory is a type of electronic memory media that can be rewritten and that can retain content without consumption of power. It is used in many portable electronic products, such as cell phones, portable computers, voice recorders, thumbnail drives and the like, as well as in many larger electronic systems, such as cars, planes, industrial control systems, etc. The fact that flash memory can be rewritten as well as its retention of data without a power source, small size and light weight have all combined to make flash memory devices useful and popular means for transporting and maintaining data.

A flash memory device can typically include a memory array that can be comprised of a plurality of memory cells that can be respectively associated with memory addresses that can be selected to determine which memory cell(s) is to be accessed in order to perform a desired operation thereon. To facilitate writing (e.g., programming) or erasing data in a memory cell, each memory cell can include a source, a gate, and a drain, for example, and certain voltages can be applied to the terminals to store a charge in or remove a charge from the memory cell. During an operation (e.g., program, erase, soft program), the drain can be set to a certain voltage level based on the type of operation being performed. Further, each memory cell can be associated with a respective word line and a respective bit line, and when a memory address is specified in an operation, the memory address can be decoded to determine which word line and bit line are to be selected in order to access the desired memory cell in the memory array. When a word line and bit line are selected for a memory cell, certain respective voltages can be supplied to the source, gate, and drain of the memory cell to facilitate performing the desired operation on the memory cell.

It can be desirable to characterize a flash memory device, for example, by setting and measuring the voltage level at the drain, so that respective optimized drain voltage levels can be determined for programming, erase, and soft programming operations. Conventionally, characterizing a flash memory device can be performed by using trim bits when the flash device is operating in user mode. Different combinations of trim bits can be employed to vary control capacitance levels associated with a voltage level that can be associated with the drain in the flash memory device. However, using trim bits to vary the drain voltage level in order to characterize a flash memory device can be inefficient as, for each trim bit combination associated with the type of operation, a test program is written to program a one-time-programming sector in the memory array in order to set the trim bits to the desired combination, then a hardware reset is performed to load the trim bits into a static random access memory (SRAM) in the memory device, user programming is performed and the drain voltage level is measured, an embedded erase is performed and the drain voltage level is measured during erase, and an embedded erase is performed and the drain voltage level is measured during soft programming. With all of these acts being performed for each trim bit combination, the characterization of the flash memory device can demand a significant amount of time to complete.

It is desirable to reduce the number of test programs as well as the number of acts to be performed in order to control and measure the drain level voltage level and characterize a flash memory device, particularly when there is a large combination of drain voltage levels for each type of operation (e.g., programming, erase, soft programming). Further, it is desirable to have the measurement flow of the drain voltage performed in an efficient manner so that the measurement flow is subject to minimal disruption due to having to change bits (e.g. trim bits, external address bits) between drain voltage measurements.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems and/or methods that facilitate characterization of memory devices (e.g., flash memory devices). A characterization component can be included that can facilitate controlling and measuring the drain voltage level of a memory device for different types of operations (e.g., program, erase, soft program), so that the characterization of the memory device can be completed in a more efficient manner. The characterization component can utilize external address bits to control and/or vary voltage regulation levels to facilitate setting and measuring respective drain voltage levels associated with the memory device for different types of operations at each address bit combination, where the memory device can be set in test mode, for example, during characterization.

In accordance with one aspect of the disclosed subject matter, the external address bits can be fixed, and can be utilized to facilitate controlling the drain voltage regulation levels during programming, erase, and/or soft programming. By using the same address bits for control, the setting and measurement of the respective drain voltage levels for different types of operations can be performed more efficiently, as the drain voltage measurement flow is not disrupted in order to change the address bits between drain voltage measurements associated with different operations.

In accordance with another aspect of the disclosed subject matter, the characterization component can employ a test program to facilitate regulating the drain voltage level associated with memory cells in a memory array in a memory device to facilitate characterization of the memory device. The characterization component can facilitate selection of external address bits and can provide the external address bits and/or external address bit information to a static random access memory (SRAM) and the external address bits can set, and/or can be stored in, the SRAM. The external address bits can be provided to a regulator component that can utilize the external address bits to facilitate determining and/or setting a capacitance level (e.g., capacitor combination). The capacitance level can facilitate controlling the regulated drain voltage level when compared with a reference voltage (e.g., $V_{ref}$) by a comparator component that can be associated with the regulator component. The regulated drain voltage level can be controlled to reach a desired regulated drain voltage level (e.g. a final regulated drain voltage level). The final regulated drain voltage level can be applied to the drain side of the memory cells in the memory array when manual program, manual erase, and/or manual soft program operations are performed. As a result, characterization of the memory device can be facilitated.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
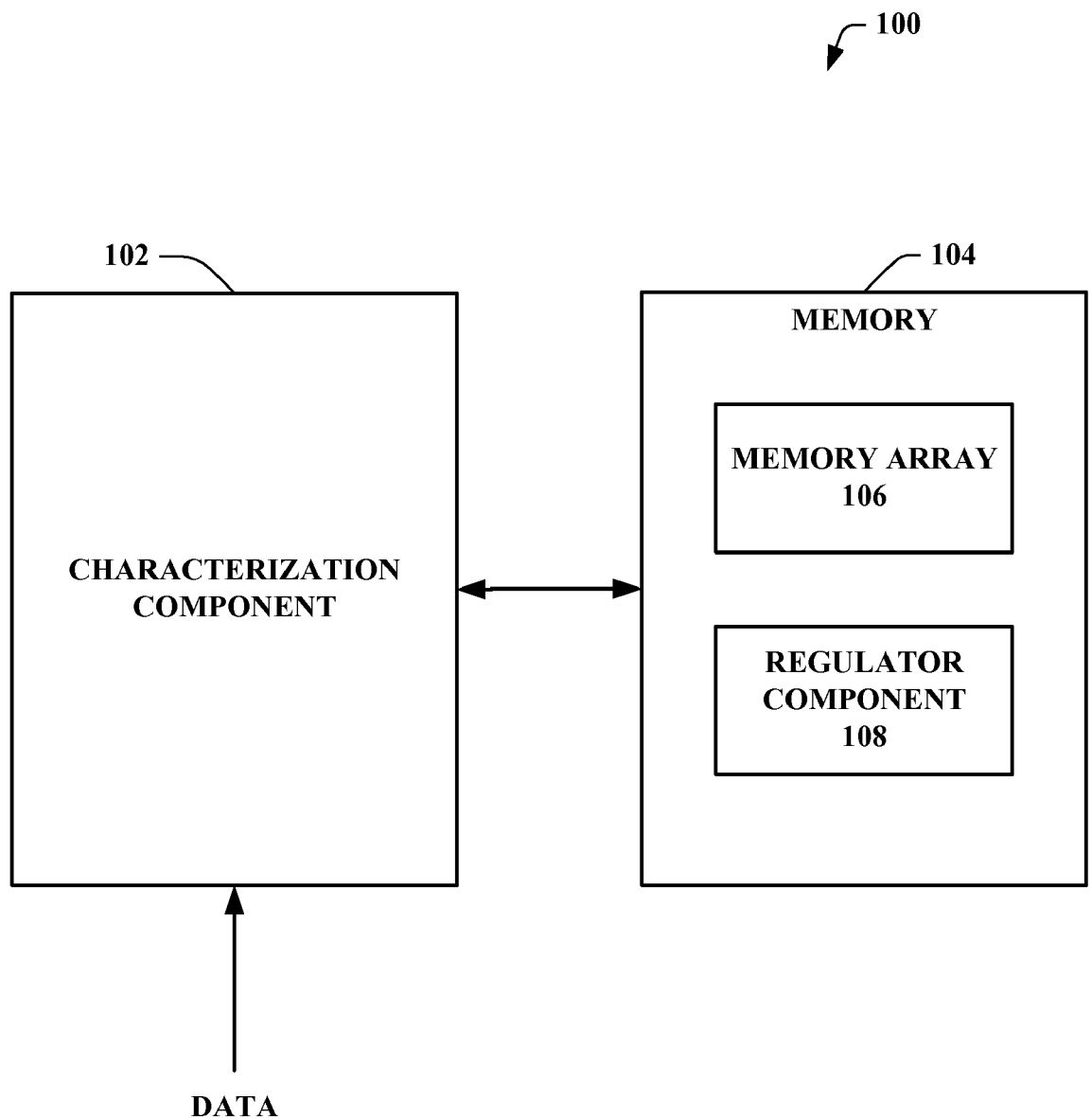
FIG. 1 illustrates a system that facilitates characterization of a memory device in accordance with an aspect of the disclosed subject matter.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Flash memory devices have become popular for use in electronic device for a variety of reasons. A flash memory device can typically include a memory array that can be comprised of a plurality of memory cells that can each include a source, a gate, and a drain, which can each have various voltages applied to facilitate performing operations (e.g., read, write, erase, soft program) based on the voltages applied.

It can be desirable to characterize a flash memory device, for example, by controlling and measuring the voltage level at the drain, so that respective optimized drain voltage levels can be determined for programming, erase, and soft programming operations. Conventionally, characterizing a flash memory device can be performed by using trim bits when the flash device is operating in user mode. However, using trim bits to vary the drain voltage level to characterize a flash memory device can be inefficient as, for each trim bit combination associated with the type of operation, multiple acts have to be repeated in order to obtain a drain voltage measurement for the particular trim bit combination. With all of these acts being performed for each trim bit combination, the characterization of the flash memory device can demand a significant amount of time to complete.

It can be desirable to reduce the number of test programs as well as the number of acts to be performed in order to control and measure the drain level voltage level and characterize a flash memory device, particularly when there is a large combination of drain voltage levels for each type of operation (e.g., programming, erase, soft programming). Further, it is desirable to have the measurement flow of the drain voltage performed in an efficient manner so that the measurement flow is subject to minimal disruption due to having to change bits (e.g., trim bits, external address bits) between drain voltage measurements.

Systems and/or methods that facilitate characterization of memory devices, such as flash memory devices, are presented. A characterization component can facilitate controlling and measuring the respective drain voltage levels of a memory device for different types of operations (e.g., programming, erase, soft programming) to facilitate characterizing of the memory device in a more efficient manner. With the memory device in test mode, the characterization component can utilize external address bits to facilitate controlling (e.g., varying) voltage regulation levels to facilitate setting and measuring respective drain voltage levels associated with the memory device for different types of operations based on an address bit combination associated with the external address bits. In accordance with one aspect of the disclosed subject matter, the external address bits can be fixed, and can be utilized to facilitate controlling the drain voltage regulation levels during manual programming, manual erase, and/or manual soft programming operations. By fixing the external address bits, the control and measurement of the respective drain voltage levels for different types of operations can be performed more efficiently, as, for example, the drain voltage measurement flow is not disrupted in order to change the address bits between drain voltage measurements associated with different operations.

Now turning to the figures, FIG. 1 depicts a system 100 that facilitates characterization of a memory device in accordance with an aspect of the disclosed subject matter. System 100 can include a characterization component 102 that can be associated with a memory device 104. Memory device 104 can be a non-volatile memory device, such as a flash memory device, including multi-bit and/or multi-level flash memory devices. The memory device 104 can include a memory array 106 that can be comprised of a plurality of memory cells (not shown) that can be associated with respective memory addresses, wherein each memory cell can store one or more bits of data. To facilitate storage or removal of data in a memory cell, the memory cell can include a source, a gate, and a drain, for example, and certain voltages can be applied to the terminals to store a charge in or remove a charge from the memory cell. During an operation (e.g. program, erase, soft program), the drain can be set to a certain voltage level based on the type of operation being performed.

Certain operations can be performed to write, read, or erase data to/from the memory device 104. For example, a write operation can be performed to write data to a memory cell(s) in memory device 104. A read operation can be performed to read data from memory device 104, where the voltage applied to a memory cell can typically be less than the voltages applied to write or erase data from the memory device 104. An erase operation can be performed to remove data from a memory cell(s) in memory device 104. A soft programming operation can be performed to raise the drain voltage level to a desired level after an erase, when the drain voltage level associated with a memory cell is not at the desired level after an erase operation has been performed. Typically, the drain voltage level associated with a soft programming operation is less than the drain voltage level associated with a write or erase operation.

After a memory device 104 has been formed, but before the device 104 is made available to a consumer, it can be desirable to test and measure the drain voltage levels for certain operations, such as programming (e.g., writing), erasing, and/or soft programming, in order to facilitate determining a desirable (e.g., optimal) respective drain voltage level for each type of operation.

Characterization component 102 can facilitate setting and measuring the respective drain voltage levels for different types of operations in the memory device 104. The characterization component 102 can utilize external address bits to facilitate controlling the voltage regulation level at each address bit combination for various operations, such as programming, erase, and soft programming, that can be performed on the memory device 104 to facilitate setting and measuring the respective drain voltage levels that can be associated with each type of operation.

In accordance with one aspect of the disclosed subject matter, the characterization component 102 can employ the same external address bits during each type of operation (e.g., program, erase, soft program), where the trimming can be the same or different for each type of operation, instead of using one address bit setting for programming, and then using a different address bit setting for an erase operation, for example. By using the same external address bits for each type of operation, the setting and measuring of the respective drain voltage levels for each type of operation can be performed more efficiently, as the measurement flow is not disrupted in order to change the address bit setting for each type of operation.

The characterization component 102 can be associated with a regulator component 108 that can be included in memory device 104, and the regulator component 108 can also be associated with the memory array 106, to facilitate setting and measuring the respective drain voltage levels associated with each type of operation for each address bit combination. The regulator component 108 can facilitate controlling drain voltage levels by employing different capacitances based on the type of operation being performed and/or the address bit combination. The capacitance can be such that the voltage level at the drain, as controlled by the capacitance, can be at a desired drain voltage level. The regulator component 108 can compare the voltage level, as controlled by the capacitance, with a reference voltage (e.g., $V_{ref}$) to facilitate setting the drain voltage level to the desired level when the voltage level, as controlled by the capacitance, is equal to or greater than the reference voltage. The characterization component 102 can monitor, analyze, and/or measure the drain voltage level for each operation at each address bit combination.

Figure 2:
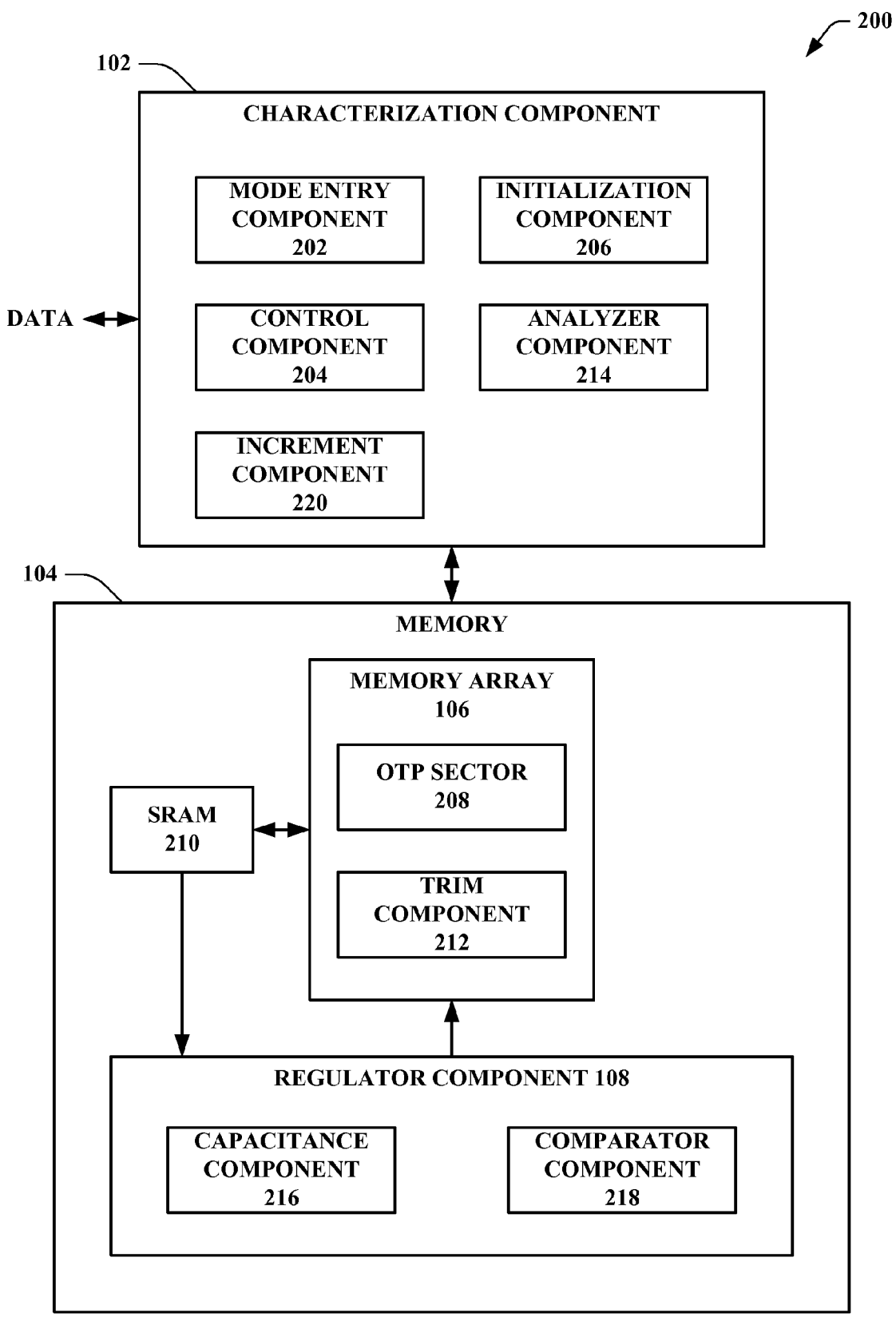
FIG. 2 illustrates a system that facilitates characterization of a memory device in accordance with an aspect of the subject matter disclosed herein.

Turning to FIG. 2, a system 200 that facilitates characterization of a memory device is illustrated. System 200 can include a characterization component 102 that can facilitate characterizing a memory device 104 that can be associated therewith. Characterizing a memory device 104 can be performed in order to determine a desired (e.g., optimal) drain voltage level for each type of operation, before making the memory device 104 available to a consumer, as a desired drain voltage level can vary from memory device to memory device.

The memory device 104 can be a non-volatile memory device, such as a flash memory device. Further, the memory device 104 can include a memory array 106 that can include a plurality of memory cells (not shown) that can be respectively associated with memory addresses that can be selected to determine which memory cell(s) is to be accessed in order to perform a desired operation thereon. Each memory cell can store one or more bits of data. To facilitate storage or removal of data in a memory cell, each memory cell can include a source (not shown), a gate (not shown), and a drain (not shown), for example, and certain voltages can be applied to the terminals of the source, gate, and/or drain to store a charge in or remove a charge from the memory cell. During an operation (e.g., program, erase, soft program), the drain can be set to a certain voltage level based on the type of operation being performed. Further, each memory cell can be associated with a respective word line (not shown) and a respective bit line (not shown), and when a memory address is specified in an operation, the memory address can be decoded to determine which word line and bit line are to be selected in order to access the desired memory cell in memory array 106. When a word line and bit line are selected for a memory cell, certain respective voltages can be supplied to the source, gate, and drain of the memory cell to facilitate performing the desired operation on the memory cell. The memory device 104 can also include a test mode that can be utilized during testing and characterization of the device 104, and/or a user mode that can be utilized during general use of the device 104 and/or during testing or characterization of the device 104. The characterization component 102 can facilitate characterizing the memory device 104, so that optimal drain voltage levels can be determined to facilitate performing operations in the memory device 104.

The characterization component 102 can include a mode entry component 202 that can receive data regarding the external address bits that can be used to control the drain voltage levels during characterization of the memory device 104. One or more external address bits can be employed as control for the drain voltage level. When employing external address bits, the memory device 104 can be in test mode.

The characterization component 102 can also include a control component 204 that can facilitate control of the drain voltage level for each type of operation being performed with regard to each address bit combination. The control component 204 can be associated with the regulator component 108 and can facilitate determining the type of operation for which the drain voltage is being set and measured and/or the address bit combination associated with such operation in order to facilitate setting and measuring the drain voltage level to the desired level based on the type of operation and/or the address bit combination.

The characterization component 102 can further include an initialization component 206 that can facilitate performing initial one-time-programming (OTP) related operations, which can be performed prior to programming, erase, or soft programming operations in order to have a reference voltage (e.g., $V_{ref}$) set at a desired level prior to performing programming, erase, or soft programming operations. The initialization component 206 can facilitate performing an OTP auto-erase of an OTP sector 208 in order to reset the information in the OTP sector 208, where the OTP sector 208 can be included in the memory array 106. The initialization component 206 can facilitate performing a hardware reset of the memory device 104 to power down the device 104 to reset the hardware components within the device 104. Upon powering up the memory device 104, data in the OTP sector 208 can be loaded into a static random access memory (SRAM) 210 that can be included in memory device 104, where the data can be associated with a trim setting associated with a trim component 212 upon which the reference voltage can be based. The reference voltage can be measured by an analyzer component 214 that can be included in characterization component 102. For example, analyzer component 214 can facilitate performing an analog measurement of the reference voltage in memory device 104.

If the reference voltage is not at a desired level when measured, the initialization component 206 can facilitate performing another OTP autoerase of the OTP sector in memory array 106. The initialization component 206 can also facilitate adjustment of the OTP trimming associated with trim component 212, so that a desired reference voltage can be reached. A hardware reset of the memory device 104 can be performed and, upon powering up the memory device 104, data associated with the reference voltage with the new OTP trimming setting can be loaded into SRAM 210. The analyzer component 214 can again measure the reference voltage to determine whether the reference voltage is at the desired level. The initialization operations can continue until the desired reference voltage has been reached.

Once the desired reference voltage has been reached, the control component 204 can facilitate performing manual program, manual erase, and manual soft program operations to set and measure the drain voltage level for each address bit combination. The control component 204 can facilitate performance of such operations in an efficient manner, so that the characterization of the memory device 104 can be realized in substantially less time than by conventional systems and methods.

The control component 204 can begin the operations with the address bit combination being set to all 0's (e.g., 000 for three bits) where the number of bits in the address bit combination can be based on the highest number of trim bits associated with a particular type of operation. For example, if it is desired that the programming has one trim bit, erase has three trim bits, and soft programming has two trim bits, the address bit combination can have three bits, since the highest number of trim bits is three, which is associated with the erase operation. Typically, the higher the number of trim bits associated with an operation, the more drain voltage level options that can be available, which can facilitate identifying a desired (e.g., optimal) drain voltage level for such operation.

The control component 204 can facilitate performing a manual programming operation with the address bit combination set to all 0's. The control component 204 can be associated with a capacitance component 216 and can facilitate choosing a capacitance level of the capacitance component 216 so that a voltage can be supplied to the drain in the memory device 104, and the drain voltage level can be set and measured for particular operation (e.g. manual programming) being performed at the specified address bit combination. In accordance with one embodiment, the capacitance component 216 can be comprised of a set of capacitors that can be employed to control the voltage that can be provided to a comparator component 218 that can be associated therewith.

The comparator component 218 can be included in the regulator component 108, and the comparator component 218 can compare the voltage level received from the capacitance component 216 with the reference voltage. When the drain voltage level reaches the desired voltage level, the comparator component 218 can close the path to the drain, so that a drain voltage level, which can be based on the capacitance level of capacitance component 216, can be maintained at the desired level, where the charge in the capacitors associated with capacitance component 216 can facilitate maintaining the drain voltage level at the desired level associated with a particular operation (e.g., manual programming) at the particular address bit combination. The analyzer component 214 can measure the drain voltage level.

The control component 204 can facilitate performing a manual erase operation to set the drain voltage to the desired level for such an operation at the particular address bit combination, where all bits are set to 0. The control component 204 can facilitate selection of a capacitance level of capacitance component 216 so that the desired drain voltage level can be reached. The comparator component 218 can close the path to the drain when the desired drain voltage level is reached, and the charge in the capacitance component 216 can facilitate maintaining the desired voltage level for the manual erase operation at that address bit combination. The analyzer component 214 can measure the drain voltage level.

The control component 204 can also facilitate performing a manual soft programming operation to set the drain voltage to the desired level for such an operation at the particular address bit combination, where all bits are set to 0. The control component 204 can facilitate selection of a capacitance level of capacitance component 216 so that the desired drain voltage level can be reached. The comparator component 218 can close the path to the drain when the desired drain voltage level is reached, and the charge in the capacitance component 216 can facilitate maintaining the desired voltage level for the manual soft programming operation at that address bit combination. The analyzer component 214 can measure the drain voltage level.

Characterization component 102 can also include an increment component 220 that can increment the address bit combination by one, after all programming operations have been completed for a particular address bit combination. For example, once the manual programming, manual erase, and manual soft programming have been completed for address bit combination at 000, where the address bit combination has three bits, the increment component 220 can increase the address bit combination by one to 001, and the manual programming, manual erase, and manual soft programming can be performed to set and measure the respective drain voltage levels for each type of operation at that address bit combination. The increment component 220 can increment the address bit combination value until all the operations have been completed (e.g., through address bit combination=111), so that the characterization of the memory device 104 can be complete.

The control component 204 can also facilitate performing such drain voltage measurements in an efficient manner by sensing or detecting that an operation associated with a particular address bit combination, or a subset thereof, has been performed. For example, if it is desired that the programming has one trim bit, erase has three trim bits, and soft programming has two trim bits, the address bit combination can be fixed at three bits (e.g., A(2:0)). Since the programming only has one bit, then manual programming can be performed at 0 or 1, for example, when the first address bit A(0) is at 0 or 1. Since the soft programming has two bits, manual soft programming can be performed at address bit combinations 00, 01, 10, or 11. Since erase has three trim bits, a manual erase can be performed at each address bit combination from 000 through 111. After the operations have been performed at 000 and 001, the manual programming can be complete, because the manual programming at 0 can be performed at address bit combination 000, and the manual programming at 1 can be performed at address bit combination 001. When the address bit combination is incremented to 010, the control component 204 can sense that the first bit is 0 again, and that manual programming has already been performed for 0, so the control component 204 can determine that this address bit combination is not available for manual programming, and can proceed to the next type of operation (e.g., manual erase).

To further illustrate with the example, the manual soft programming can be complete after the operations have been completed for 011. Thus, when the increment component 220 increments the address bit combination to 100, the control component 204 can sense that the first bit is 0, so the address bit combination is not available for manual programming. The manual erase can be performed at address bit combination 100, because the erase is associated with three trim bits, and the manual erase at that address bit combination has yet to be performed. The control component 204 can sense that the manual soft programming at address bit combination 100 is not available to be performed, because the manual soft programming, which is associated with two trim bits, has already been performed at 00. The control component 204 can proceed, without performing a manual soft programming at address bit combination 100, to the next available operation, which, in this example, can be to perform a manual erase at address bit combination 101, then a manual erase at address bit combination 110, and then a manual erase operation at address bit combination 111. At this point, the control component 204 can sense that all programming operations have been completed for all address bit combinations, and the characterization of the memory device 104 can be complete.

In accordance with one aspect of the disclosed subject matter, the characterization component 102 can employ a test program to facilitate regulating the drain voltage level associated with memory cells in memory array 106 to facilitate characterization of the memory device. The characterization component 102 can provide desired external address bits and/or external address bit information to the SRAM 210 and the external address bits can set the SRAM 210 and/or can be stored in SRAM 210. The external address bit information can be provided to the regulator component 108 and can be utilized by the regulator component 108 to facilitate determining and/or setting the capacitance level (e.g., capacitor combination) of the capacitance component 216. The capacitance level of the capacitance component 216 can facilitate controlling the regulated drain voltage level when compared with the reference voltage (e.g., $V_{ref}$) by the comparator component 218. The regulated drain voltage level can be controlled to reach a desired regulated drain voltage level, which can be a final regulated drain voltage level. The final regulated drain voltage level can be applied to the drain side of the memory cells in memory array 106 when manual program, manual erase, and/or manual soft program operations are performed.

In accordance with another aspect of the disclosed subject matter, system 200 (and/or system 100), or portions thereof (e.g., flash memory device), can be included in electronic devices, such as a computer, a personal digital assistant (PDA), a cellular phone, a digital phone, an answering machine, a video device (e.g., television, or digital versatile disk (DVD) player/recorder), a music player/recorder (e.g., compact disc (CD) player, MP3 player), a digital recorder, a digital camera, a microwave oven, an electronic organizer, an electronic toy, an electronic game, a scanner/reader, and the like, as well as other peripheral devices (e.g., printer) or other electronic devices (e.g., a copy machine, a facsimile machine) that include a memory component.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 3:
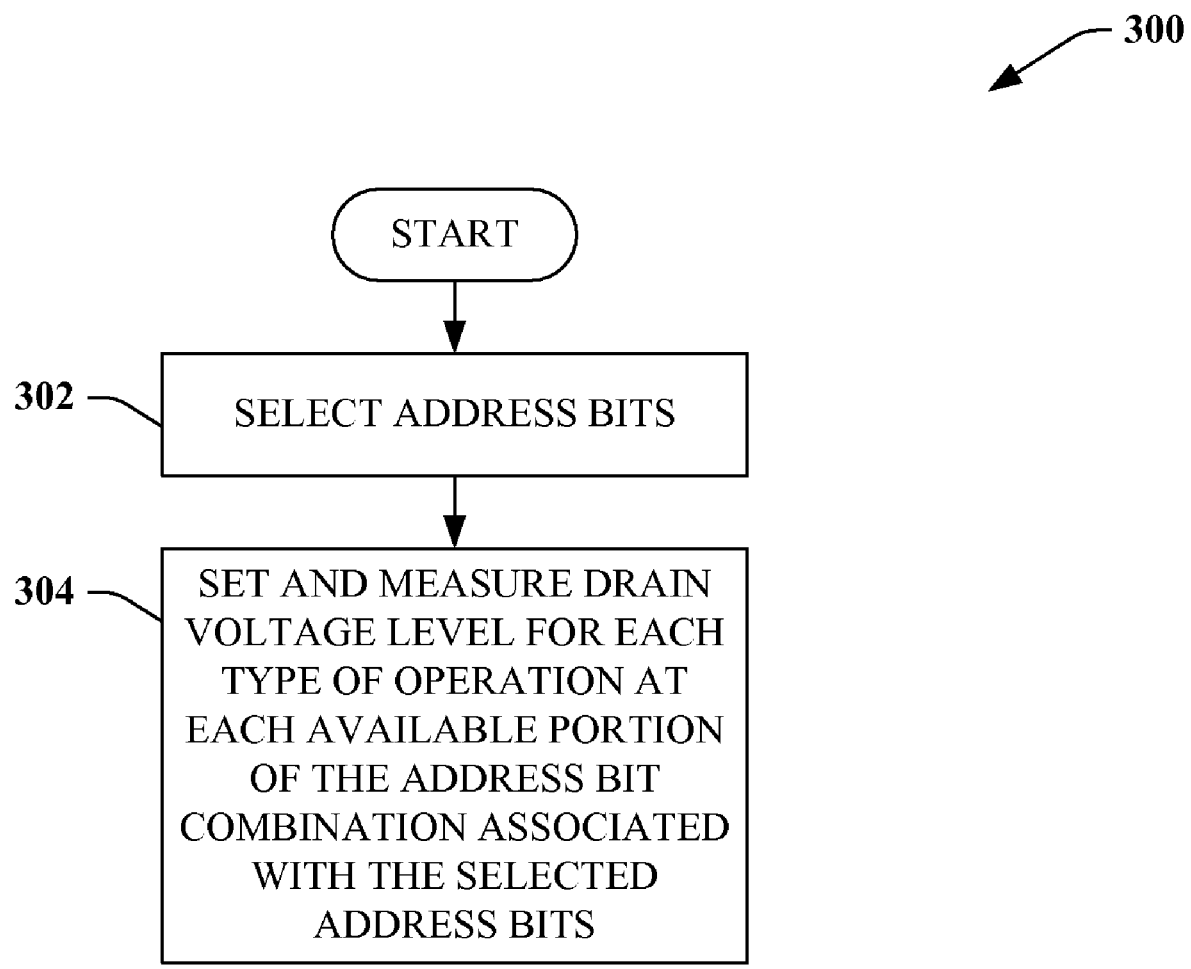
FIG. 3 illustrates a methodology that facilitates characterizing a memory device in accordance with an aspect of the disclosed subject matter.
Figure 4:
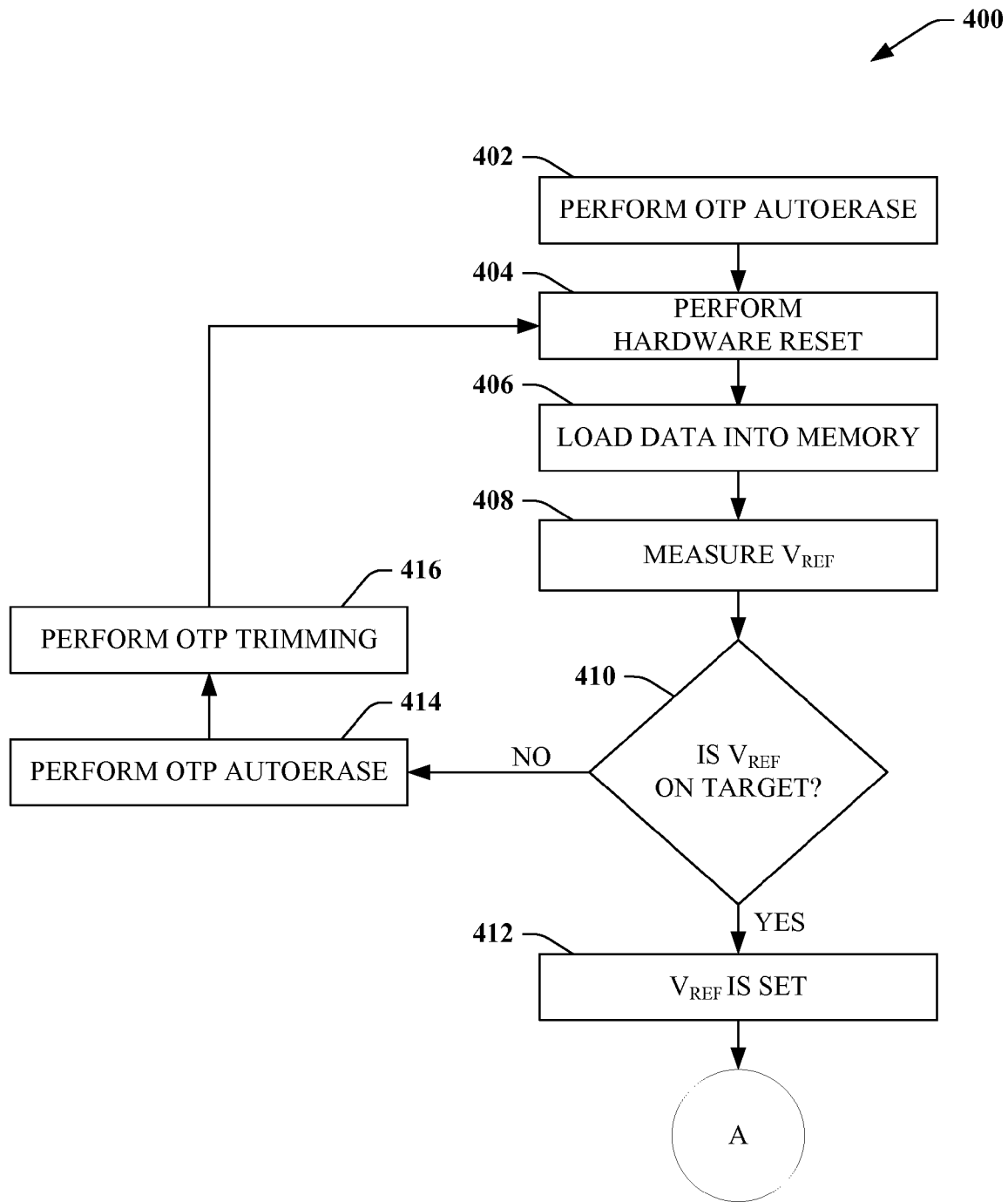
FIG. 4 illustrates a methodology that facilitates setting a reference voltage to facilitate characterizing a memory device in accordance with an aspect of the disclosed subject matter.
Figure 5:
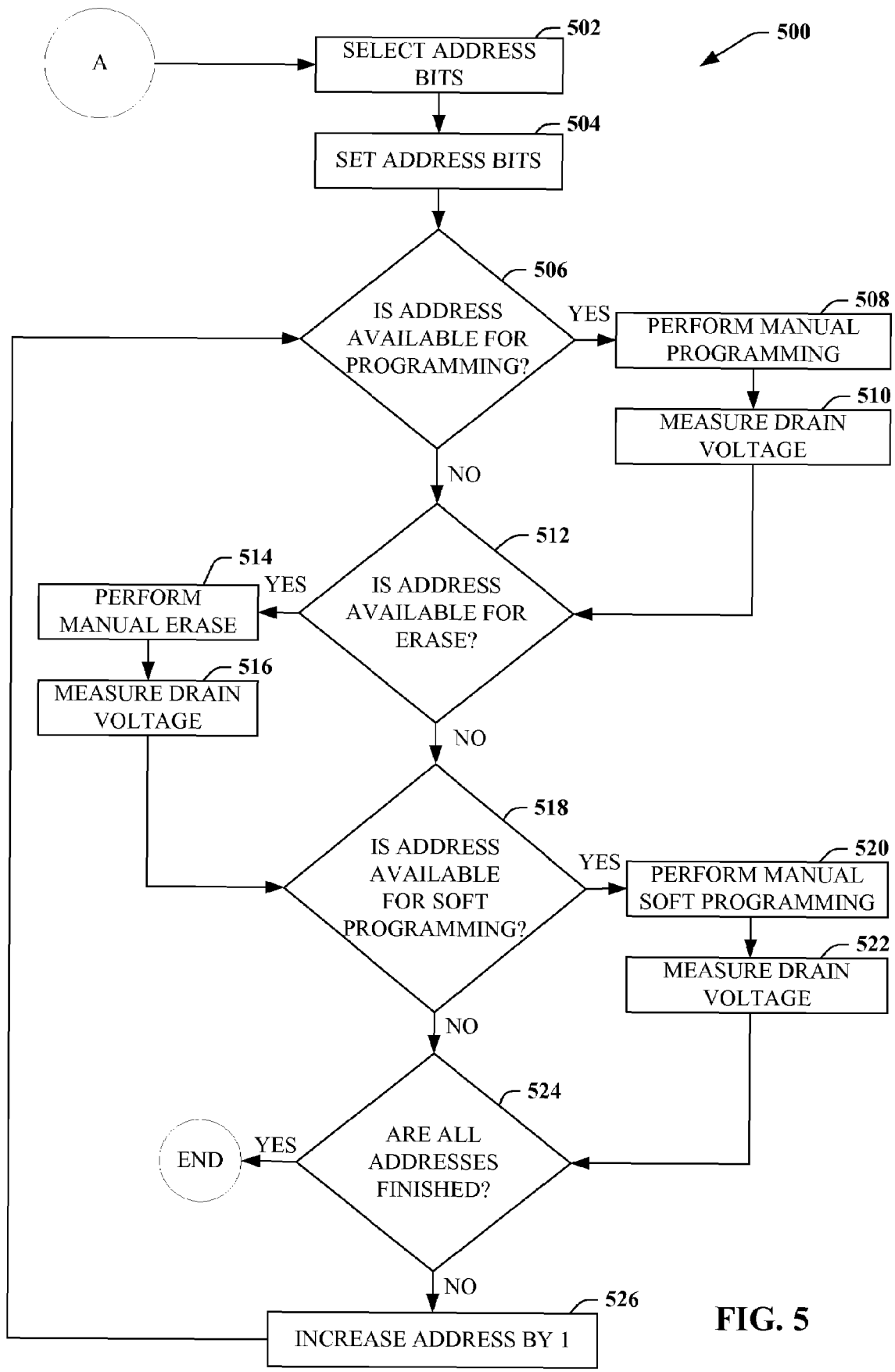
FIG. 5 illustrates a methodology that facilitates characterizing a memory device in accordance with an aspect of the subject matter disclosed herein.

FIGS. 3-5 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring to FIG. 3, a methodology 300 that facilitates characterizing a memory device in accordance with the disclosed subject matter is illustrated. At 302, a number of external address bits can be selected. The number of external address bits selected can be as desired, where the higher the number of external address bits, typically the more choices available from which to determine an optimal drain voltage level. The external address bits can be fixed during the setting and measuring of the drain voltage levels for the programming (e.g., manual programming, manual erase, manual soft programming) of the memory device (e.g., flash memory device 104) at each address bit combination available for programming with regard to the particular type of programming operation. If the external address bits are fixed, then the address bits can remain the same, even when the programming operation to be performed changes. With the external address bits fixed, the measurement flow of the drain voltage levels can proceed more efficiently and quickly, as the measurement flow is not disrupted by changing address bits based on the type of programming operation being performed.

At 304, respective drain voltage levels can be set and measured for each programming operation at each address bit combination available for programming based on the external address bits selected. For example, initially the address bit combination can be set so that each address bit is 0 (e.g., 000 for three bits). At that address bit combination, which can be available for manual programming since no programming has been performed yet, a manual programming can be performed to set and measure the voltage drain level to the desired voltage level, which can be a predetermined voltage level associated with the programming operation (e.g., manual programming) at that address bit combination (e.g., 000 for three bits). A manual erase can be performed at that address combination to set and measure the voltage drain level to the desired voltage level, which can be a predetermined voltage level associated with the programming operation (e.g., manual erase) at that address bit combination.

Further, a manual soft programming can be performed at that address combination to set and measure the voltage drain level to the desired voltage level, which can be a predetermined voltage level associated with the programming operation (e.g. manual soft programming) at that address bit combination. The programming can continue until all the programming operations have been completed at each address bit combination available for programming with regard to the respective types of programming operations. At this point methodology 300 can end.

Turning to FIG. 400, depicted is a methodology 400 that facilitates setting a reference voltage to facilitate characterizing a memory device in accordance with the disclosed subject matter. At 402, an autoerase of an OTP sector (e.g., 208) can be performed to reset information in the OTP sector. At 404, a hardware reset of the memory device (e.g., 104) can be performed. For example, the memory device can be powered down to facilitate resetting the memory device and hardware components therein. At 406, data can be loaded into SRAM (e.g. 210). For example, data associated with the trim bits can be loaded into SRAM when the memory device is powered up after the hardware reset is performed, at 404. At 408, the reference voltage, which can have a voltage level based on the trim settings associated with the trim bits, can be measured, for example, by an analyzer component (e.g., 214). At 410, a determination can be made as to whether the measured reference voltage is at a desired voltage level, where the desired reference voltage can be a predetermined voltage level based on the memory device.

If, at 410, it is determined that the measured reference voltage is at the desired voltage level, then, at 412, the reference voltage is set at the measured voltage level, as measured at 408. If, at 410, it is determined that the measured reference voltage is not at the desired voltage level, then, at 414, an autoerase can be performed on the OTP sector to reset the information in the OTP sector. At 416, OTP trimming can be performed to adjust the trimming associated with the trim bits. At this point, methodology 400 can return to reference numeral 404 to perform a hardware reset, and can continue until the desired reference voltage has been obtained. For example, after the hardware reset, methodology 400 can then continue by loading the data associated with the trim bits having the new OTP trimming into the SRAM, and measure the reference voltage associated with the new OTP trimming, which can be analyzed and/or compared to determine whether the measured reference voltage is on target with the desired reference voltage level. Once the desired reference voltage level has been obtained, the methodology 400 can reach point A. At this point, methodology 400 can end.

FIG. 5 illustrates a methodology 500 that facilitates characterizing memory device in accordance with the disclosed subject matter. Methodology 500 can proceed from point A, where a desired reference voltage level for the memory device has been obtained. At 502, a number of external address bits can be selected. For example, the number of external address bits can be selected based on the number of trim bits associated with a program operation having the highest number of trim bits. That is, if programming has one trim bit, erase has three trim bits, and soft programming has two trim bits, then three external address bits (e.g., A(2:0)) can be selected, since the erase operation has the highest number of trim bits, and that number is three bits. The number of trim bits associated with a type of programming operation can be as desired, where more trim bits can result in more drain voltage level options available to be utilized to locate an optimal or desired drain voltage level. However, the higher the number of trim bits, the more settings and measurements of drain voltage levels that are to be performed to complete the characterization of the memory device. Further, the external address bits selected can be fixed over all programming operations when performing the characterization of the memory device, which can be more efficient, as the measurement flow does not have to be disrupted by changing the address bits when performing a different programming operation.

At 504, the selected external address bits can be set. For example, the address bits can each be set to 0. Thus, if there are three address bits, then the address bit combination can be set to 000. The selected external address bits can be incorporated inside an entry code associated with the mode entry component 202, for example.

At 506, a determination can be made as to whether the current address bit combination is available for manual programming. If it is determined that the combination is available for manual programming, that is, if it is determined that manual programming has not yet been performed for the portion of the address bit combination applicable to the manual programming, then, at 508, manual programming can be performed at the current address bit combination to set the drain voltage at the predetermined voltage level associated with manual programming based on the applicable portion of the address bit combination. For example, if manual programming is only being performed with one trim bit, then only the first bit (e.g., A(0)) of the external address bit combination is applicable to the manual programming. Thus, for example, the manual programming can be performed at address bit combinations 000 and 001, at which point the manual programming can be complete. So, when the first bit becomes zero again, for example, at 010, the address bit combination is not available for manual programming because programming has already been performed where the first address bit is zero. At 510, the drain voltage level can be measured, for example, by an analyzer component.

If, at 506, it is determined that the address bit combination is not available for programming, that is, if it is determined that manual programming has already been performed for the applicable portion of the address bit combination, at 512, a determination can be made as to whether the address bit combination is available for an erase operation. That is, a determination can be made as to whether a manual erase can be performed at the current address bit operation. For example, the control component 204 can sense or detect when a particular operation has been performed at an applicable portion of the address bit combination, so that such operation can be bypassed and the next operation that has yet to be performed can be located. If at 512, it is determined that the address bit combination is available for erase, such as, for example, where the manual erase operation has not been performed for the portion of the address bit combination applicable to the erase operation, then, at 514, a manual erase can be performed to set the drain voltage to a predetermined voltage level associated with a manual erase based on the applicable portion of the address bit combination. For example, if there are two trim bits associated with the erase, then the first two bits (e.g., A(1:0)) can be the applicable portion of the address bit combination that can be available for manual erase operations. That is, address bit combinations, 000, 001, 010, and 011 can be available for programming. Once address bit combination 100 is reached, the first two bits will be at 00 again, for which a manual erase has already been performed, and is therefore not available for manual erase. At 516, the drain voltage level associated with the manual erase at the current address bit combination can be measured, for example, by the analyzer component.

If, at 512, it is determined that the address bit combination is not available for an erase operation, that is, if it is determined that a manual erase has already been performed for the applicable portion of the address bit combination, at 518, a determination can be made as to whether the address bit combination is available for a soft programming operation. That is, a determination can be made as to whether a manual soft programming can be performed at the current address bit operation. If at 518, it is determined that the address bit combination is available for soft programming, such as, for example, where the manual soft programming has not been performed for the portion of the address bit combination applicable to the soft programming operation, then, at 520, a manual soft programming can be performed to set the drain voltage to a predetermined voltage level associated with a manual soft programming based on the applicable portion of the address bit combination. At 522, the drain voltage level associated with the manual soft programming at the current address bit combination can be measured, for example, by the analyzer component.

If, at 518, it is determined that the address bit combination is not available for a manual soft programming operation, that is, if it is determined that a manual soft programming has already been performed for the applicable portion of the address bit combination, at 524, a determination can be made as to whether all of the address bit combinations are completed; that is, a determination can be made as to whether all of the operations have been performed for all of the respective available address bit combinations. If all of the operations have been performed at all available address bit combinations, then the characterization of the memory device with regard to the drain voltage is completed.

If, at 524, it is determined that all of the address bit combinations are finished, that is, if it is determined that all of the operations have be performed for all respective available address bit combinations, then, at 526, the address bit combination can be increase by one. For example, if the address bit combination is at 000, then the address bit combination can be increased to 001. After incrementing the address bit combination, methodology 500 can return to reference numeral 506, and can proceed until all address bit combinations have been completed, so that all operations have been performed at all respective available address bit combinations. At this point, methodology 500 can end.

As an example of the drain voltage measurement flow in accordance with methodology 500, a characterization of a memory device can be desired based on the following table:

| Drain Voltage For Programming With 1 Trim Bit | | |
|---|---|---|
| TRIM(0) | A(0) | DRAIN VOLTAGE (V) |
| 0 | 0 | 5.6 |
| 1 | 1 | 5.7 |

| Drain Voltage For Erase With 3 Trim Bits | | |
|---|---|---|
| TRIM(3:1) | A(2:0) | DRAIN VOLTAGE (V) |
| 000 | 000 | 5.6 |
| 001 | 001 | 5.7 |
| 010 | 010 | 5.8 |
| 011 | 011 | 5.9 |
| 100 | 100 | 6.0 |
| 101 | 101 | 6.1 |
| 110 | 110 | 6.2 |
| 111 | 111 | 6.3 |

-continued

| Drain Voltage for Soft Programming With 2 Trim Bits | | |
|---|---|---|
| TRIM(5:4) | A(1:0) | DRAIN VOLTAGE (V) |
| 00 | 00 | 3.6 |
| 01 | 01 | 3.7 |
| 10 | 10 | 3.8 |
| 11 | 11 | 3.9 |

Prior to performing drain voltage measurements, the desired reference voltage can be obtained, for example, in accordance with methodology 500. As can be seen from the example table, the drain voltage for programming is with one trim bit, the drain voltage for erase is with three trim bits, and the drain voltage for soft programming is with two trim bits. The external address bits can be fixed at A(2:0), since the highest number of trim bits for a type of operation is three trim bits, which is associated with the erase. Also, the address bit combination, A(2:0), can be set to 000. The address bits can be incorporated in the entry code that can be associated with the mode entry component (e.g., 202), when manual programming, manual erase, and manual soft programming is performed.

With the address bit combination set at 000, it is determined whether the manual programming is to be performed at that address bit combination. Since A(0)=0 in the address bit combination, and since A(0)=0 is one of the address bit combinations for which manual programming is desired, manual programming can be performed to set the drain voltage at 5.6 volts, which can be measured, for example, by the analyzer component.

With the address bit combination still set at 000, it is determined whether a manual erase is to be performed at that address bit combination. Since A(2:0)=000 is the address bit combination, and since A(2:0)=000 is one of the address bit combinations for which manual erase is desired, a manual erase can be performed to set the drain voltage level at 5.6 volts, which can be measured by the analyzer component.

With the address bit combination remaining set at 000, it is determined whether a manual soft programming is to be performed at that address bit combination. Since A(1:0)=00 is the address bit combination, and since A(1:0)=00 is one of the address bit combinations for which manual soft programming is desired, a manual soft programming can be performed to set the drain voltage level at 3.6 volts, which can be measured by the analyzer component.

Since all of the operations have not been completed, the address bit combination can be incremented, for example, by the increment component 220 to increase the address bit combination to 001. It can then be determined whether the manual programming is to be performed at that address bit combination. Since A(0)=1 in the address bit combination, and since A(0)=1 is an address bit combination for which manual programming is desired, manual programming can be performed to set the drain voltage at 5.7 volts, which can be measured by the analyzer component.

With the address bit combination still set at 001, it can be determined whether a manual erase is to be performed at that address bit combination. Since A(2:0)=001 is the address bit combination, and since A(2:0)=001 is one of the address bit combinations for which manual erase is desired, a manual erase can be performed to set the drain voltage level at 5.7 volts, which can be measured by the analyzer component.

With the address bit combination remaining set at 001, it can be determined whether a manual soft programming is to be performed at that address bit combination. Since $A(1:0)=01$ is the address bit combination, and since $A(1:0)=01$ is one of the address bit combinations for which manual soft programming is desired, a manual soft programming can be performed to set the drain voltage level at 3.7 volts, which can be measured by the analyzer component.

Again, since all of the characterization operations have not been completed, the address bit combination can be incremented by the increment component 220 to raise the address bit combination to 010. It can then be determined whether the manual programming is to be performed at that address bit combination. With the address bit combination $A(2:0)=010$, the first address bit $A(0)=0$, and manual programming has already been performed for $A(0)=0$, so manual programming does not have to be performed at $A(2:0)=010$. The control component 204 can detect that manual programming has already been performed at $A(0)=0$, and, as a result, can bypass manual programming at $A(2:0)=010$, and can proceed to determine whether any other operations can be performed at the current address bit combination.

With the address bit combination still set at 010, it can be determined whether a manual erase is to be performed at that address bit combination. Since $A(2:0)=010$ is the address bit combination, and since $A(2:0)=010$ is one of the address bit combinations for which manual erase is desired, a manual erase can be performed to set the drain voltage level at 5.8 volts, which can be measured by the analyzer component.

With the address bit combination remaining set at 010, it can be determined whether a manual soft programming is to be performed at that address bit combination. Since $A(1:0)=10$ is the address bit combination, and since $A(1:0)=10$ is one of the address bit combinations for which manual soft programming is desired, a manual soft programming can be performed to set the drain voltage level at 3.8 volts, which can be measured by the analyzer component.

Since all operations have not been completed, the address bit combination can be incremented to 011, where the control component 204 can detect that manual programming has already been performed for $A(0)=1$, and can bypass manual programming for the current address bit combination, $A(2:0)=011$. Control component 204 can then determine that a manual erase can be performed at that address bit combination and, in coordination with the regulator component 108, can facilitate setting the drain voltage level to 5.9 volts, and this drain level voltage can be measured by the analyzer component. Control component 204 can then determine that a soft programming can be performed at such address bit combination and can facilitate setting the drain voltage to 3.9 volts.

At this point, the increment component 220 can raise the address bit combination to 100. As can be seen, for the remaining address bit combinations of 100 through 111, manual programming can be bypassed by the control component 204 because manual programming has been completed. Further, soft programming can be bypassed, since soft programming has been performed at all available address bit combinations for $A(1:0)$, so control component 204 can detect this and can bypass soft programming at the remaining address bit combinations. Thus, for each remaining address bit combination, the manual programming can be bypassed, a manual erase can be performed to set the drain voltage level to the desired voltage level specified at the particular address bit combination, which can be measured by the analyzer component, and the soft programming can be bypassed. Once the operations associated with $A(2:0)=111$ have been performed, the control component 204 can determine that all operations have been performed to set and measure the drain voltage levels in the memory device and the characterization of the memory device with regard to drain voltage can be complete.

By employing external address bits to facilitate characterization of the memory device, the test programs employed by the characterization component 102 can be less involved, as programming trim bits into the OTP sector and performing a hardware reset for each operation is obviated, thereby enabling characterization to be performed in a more efficient manner. Further, with the control component 204 detecting and bypassing operations and measurements that have already been performed, the characterization component 102 can facilitate characterizing the memory device in a time-efficient manner.

It is to be appreciated that the number of trim bits employed, and the voltage levels specified in the above example and table, are for example purposes only and the disclosed subject matter is not so limited. The number of trim bits associated with a type of operation can be in any suitable amount, as determined and/or desired by the manufacturer and/or consumer. Further, the drain voltage levels to be set and measured in the memory device can be in any suitable level, as determined and/or desired by the manufacturer and/or consumer.

It should be appreciated that the methodologies disclosed herein and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 6:
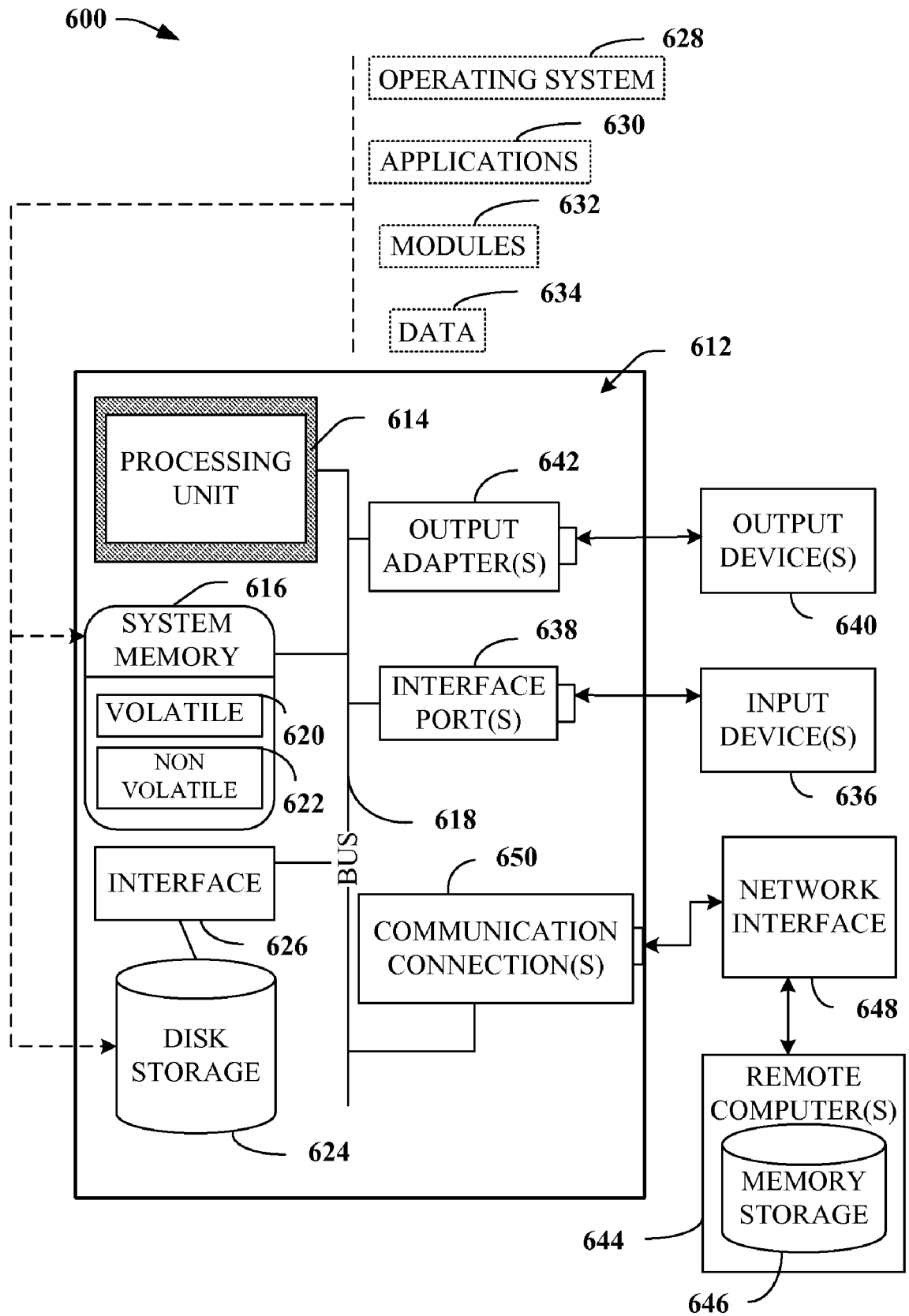
FIG. 6 is a schematic block diagram illustrating a suitable operating environment.
Figure 7:
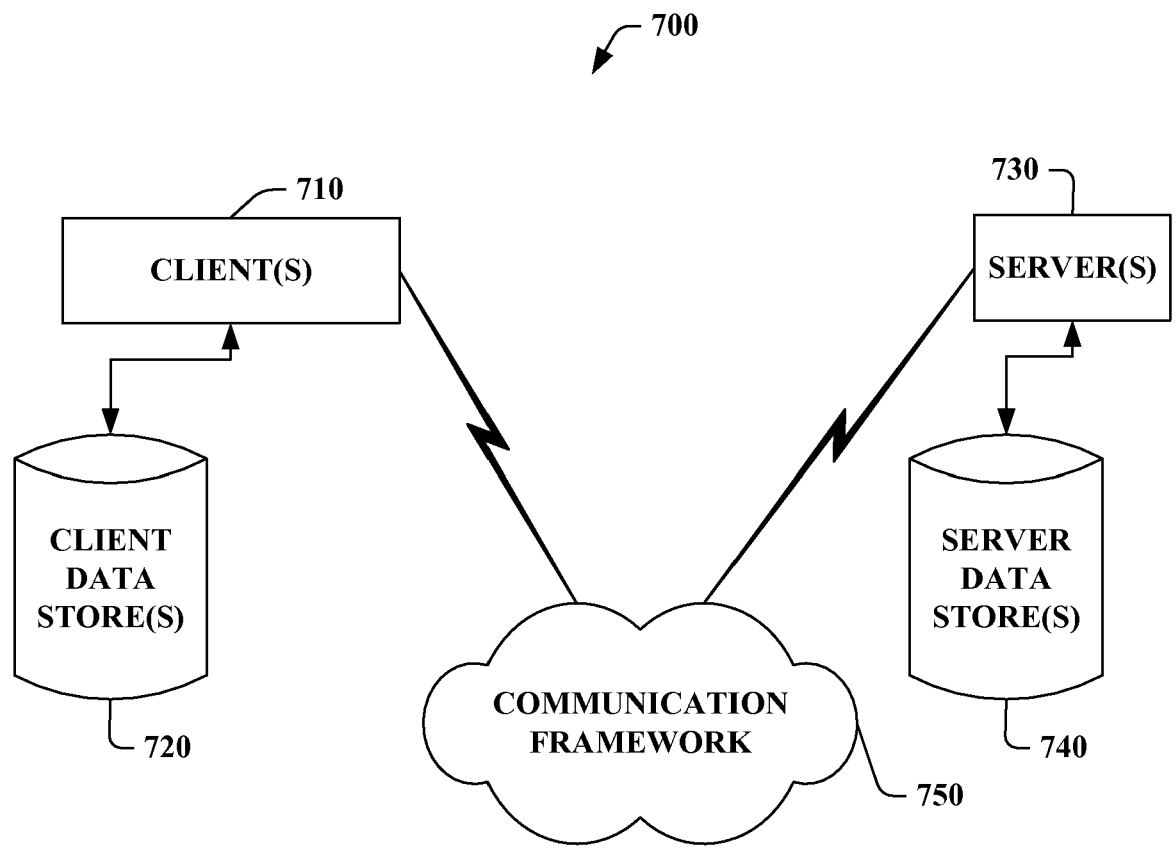
FIG. 7 is a schematic block diagram of a sample-computing environment.

In order to provide a context for the various aspects of the disclosed subject matter, FIGS. 6 and 7 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone computers. In a distributed computing environment, program modules may be located in both local and remote memory storage devices.

With reference to FIG. 6, a suitable environment 600 for implementing various aspects of the claimed subject matter includes a computer 612. The computer 612 includes a processing unit 614, a system memory 616, and a system bus 618. The system bus 618 couples system components including, but not limited to, the system memory 616 to the processing unit 614. The processing unit 614 can be any of various available processors. Dual microprocessors and other multi-processor architectures also can be employed as the processing unit 614.

The system bus 618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 616 includes volatile memory 620 and nonvolatile memory 622. The basic input/output system (BIOS), containing the basic routines to transfer information between elements within the computer 612, such as during start-up, is stored in nonvolatile memory 622. By way of illustration, and not limitation, nonvolatile memory 622 can include ROM, PROM, electrically programmable ROM (EPROM), electrically erasable programmable ROM (EEPROM), or flash memory. Volatile memory 620 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 612 also includes removable/non-removable, volatile/non-volatile computer storage media. FIG. 6 illustrates, for example, a disk storage 624. Disk storage 624 includes, but is not limited to, devices like a magnetic disk drive, floppy disk drive, tape drive, Jaz drive, Zip drive, LS-100 drive, flash memory card, or memory stick. In addition, disk storage 624 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 624 to the system bus 618, a removable or non-removable interface is typically used, such as interface 626.

It is to be appreciated that FIG. 6 describes software that acts as an intermediary between users and the basic computer resources described in the suitable operating environment 600. Such software includes an operating system 628. Operating system 628, which can be stored on disk storage 624, acts to control and allocate resources of the computer system 612. System applications 630 take advantage of the management of resources by operating system 628 through program modules 632 and program data 634 stored either in system memory 616 or on disk storage 624. It is to be appreciated that the disclosed subject matter can be implemented with various operating systems or combinations of operating systems.

A user enters commands or information into the computer 612 through input device(s) 636. Input devices 636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 614 through the system bus 618 via interface port(s) 638. Interface port(s) 638 include, for example, a serial port, a parallel port, a game port, and a universal serial bus (USB). Output device(s) 640 use some of the same type of ports as input device(s) 636. Thus, for example, a USB port may be used to provide input to computer 612, and to output information from computer 612 to an output device 640. Output adapter 642 is provided to illustrate that there are some output devices 640 like monitors, speakers, and printers, among other output devices 640, which require special adapters. The output adapters 642 include, by way of illustration and not limitation, video and sound cards that provide a means of connection between the output device 640 and the system bus 618. It should be noted that other devices and/or systems of devices provide both input and output capabilities such as remote computer(s) 644.

Computer 612 can operate in a networked environment using logical connections to one or more remote computers, such as remote computer(s) 644. The remote computer(s) 644 can be a personal computer, a server, a router, a network PC, a workstation, a microprocessor based appliance, a peer device or other common network node and the like, and typically includes many or all of the elements described relative to computer 612. For purposes of brevity, only a memory storage device 646 is illustrated with remote computer(s) 644. Remote computer(s) 644 is logically connected to computer 612 through a network interface 648 and then physically connected via communication connection 650. Network interface 648 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 650 refers to the hardware/software employed to connect the network interface 648 to the bus 618. While communication connection 650 is shown for illustrative clarity inside computer 612, it can also be external to computer 612. The hardware/software necessary for connection to the network interface 648 includes, for exemplary purposes only, internal and external technologies such as, modems including regular telephone grade modems, cable modems and DSL modems, ISDN adapters, and Ethernet cards.

FIG. 7 is a schematic block diagram of a sample-computing environment 700 with which the subject innovation can interact. The system 700 includes one or more client(s) 710. The client(s) 710 can be hardware and/or software (e.g., threads, processes, computing devices). The system 700 also includes one or more server(s) 730. Thus, system 700 can correspond to a two-tier client server model or a multi-tier model (e.g., client, middle tier server, data server), amongst other models. The server(s) 730 can also be hardware and/or software (e.g., threads, processes, computing devices). The servers 730 can house threads to perform transformations by employing the subject innovation, for example. One possible communication between a client 710 and a server 730 may be in the form of a data packet transmitted between two or more computer processes.

The system 700 includes a communication framework 750 that can be employed to facilitate communications between the client(s) 710 and the server(s) 730. The client(s) 710 are operatively connected to one or more client data store(s) 720 that can be employed to store information local to the client(s) 710. Similarly, the server(s) 730 are operatively connected to one or more server data store(s) 740 that can be employed to store information local to the servers 730.

As utilized herein, terms "component," "system," and the like, are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g. explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates characterization of a memory, comprising:
   a characterization component that utilizes external address bits that are fixed to facilitate control and measurement of drain voltage levels associated with a drain for respective operations in the memory to facilitate characterization of the memory, the characterization component detects if an operation has been performed based on a portion of an address bit combination and performs the operation if it has not yet been performed and bypasses the operation if the operation has been performed; and
   the memory that includes a memory array associated with the drain.

2. The system of claim 1, the operation is one of a manual program, a manual erase, or a manual soft program.

3. The system of claim 1, further comprising a control component that controls a type of operation to be performed at a particular portion of the address bit combination, provides information associated with the portion of the address bit combination to a capacitance component to facilitate determination of a capacitance level to facilitate control of a voltage level at the drain.

4. The system of claim 3, further comprising a capacitance component that is set to a capacitance level based on the operation to be performed and the portion of the address bit combination.

5. The system of claim 1, further comprising a regulator component that facilitates regulation of the voltage level at the drain.

6. The system of claim 1, further comprising a trim component that facilitates control of a trim level in a one-time-program sector in the memory array.

7. The system of claim 6, further comprising an initialization component that facilitates control of a voltage level based on the trim level to set a reference voltage.

8. The system of claim 1, further comprising a mode entry component that receives data associated with external address bits.

9. The system of claim 1, further comprising an analyzer component that measures the voltage level at the drain and facilitates control of the voltage level at the drain.

10. The system of claim 1, the memory device is a flash memory device.

11. An electronic device comprising the memory of claim 1, the electronic device comprising at least one of a computer, a personal digital assistant, a cellular phone, a digital phone, an answering machine, a video device, a television, a digital versatile diskplayer/recorder, a music player/recorder, an MP3 player, a digital recorder, a digital camera, a microwave oven, an electronic organizer, an electronic toy, an electronic game, a scanner, a reader, a printer, a copy machine, or a facsimile machine, or a combination thereof.

12. A method for characterizing a memory device, comprising:
receiving data associated with one or more external address bits;
setting a voltage level at a drain associated with the memory device to a predetermined voltage level based on a type of operation and a subset of an address bit combination associated with the received external address bits;
performing an autoerase of a one-time-programming sector in the memory device;
performing a hardware reset of the memory device; and
transferring data associated with a trim level into a portion of memory in the memory device.

13. The method of claim 12, further comprising:
controlling a capacitance level based on the type of operation and the subset of the address bit combination;
generating a voltage level based on the capacitance level;
comparing the voltage level based on the capacitance level to a reference voltage level;
closing a circuit associated with the drain to set the drain voltage when the voltage level based on the capacitance level is equal to the reference voltage level; and
measuring a voltage level associated with the drain.

14. The method of claim 12, further comprising:
measuring a reference voltage level, the reference voltage level is based on the trim level; and
determining if the reference voltage level is at a predetermined voltage level.

15. The method of claim 14, further comprising:
performing an autoerase of the one-time-programming sector if the reference voltage level is not at a predetermined voltage level; and
controlling the trim level to adjust the trim level to facilitate controlling the reference voltage level.

16. The method of claim 14, further comprising:
setting the reference voltage level at the measured reference voltage level if the reference voltage level is at the predetermined voltage level.

17. The method of claim 12, further comprising:
determining if the type of operation at a respective address bit combination is to be performed based on a subset of the respective address bit combination that is associated with a number of trim bits associated with the type of operation, the type of operation is one of a manual programming, a manual erase, or a manual soft programming; and
performing the type of operation if the type of operation has not yet been performed with regard to the subset of the respective address bit combination that is associated with the number of trim bits associated with the type of operation; or
bypassing the type of operation is the type of operation has already been performed with regard to the subset of the respective address bit combination that is associated with the number of trim bits associated with the type of operation.

18. A system for characterizing a memory, comprising:
means for setting drain voltage levels associated with a drain that is associated with a memory array in the memory;
means for measuring the drain voltage level; and
means for detecting if an operation has been performed based on a subset of an address bit combination where the subset is based on a number of trim bits associated with the operation, the operation is one of manual programming, manual erase, or manual soft programming.

19. The system of claim 18, further comprising:
means for performing the operation if the operation has not yet been performed based on the subset of the address bit combination; and
means for bypassing the operation if the operation has already been performed based on the subset of the address bit combination.

20. The system of claim 19, further comprising:
means for selecting a capacitance level to facilitate setting a respective drain voltage level;
means for controlling the voltage level at the drain;
means for comparing a voltage level, associated with the drain, with a reference voltage level;
means for closing a circuit when the voltage level associated with the drain is equivalent to the reference voltage level to set the voltage level at the drain; and
means for measuring the voltage level at the drain.

* * * * *